United States Patent
Van de Graaff et al.

(10) Patent No.: US 6,297,998 B1
(45) Date of Patent: *Oct. 2, 2001

(54) METHOD AND APPARATUS FOR PROGRAMMABLE CONTROL SIGNAL GENERATION FOR A SEMICONDUCTOR DEVICE

(75) Inventors: Scott D. Van de Graaff; Stephen R. Porter, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/678,979

(22) Filed: Oct. 5, 2000

Related U.S. Application Data

(63) Continuation of application No. 09/388,694, filed on Sep. 2, 1999, now Pat. No. 6,141,272.

(51) Int. Cl.[7] .................................................. G11C 7/00
(52) U.S. Cl. .................... 365/201; 365/200; 365/230.06; 365/185.22
(58) Field of Search .................................. 365/201, 200, 365/230.06, 185.22

(56) References Cited

U.S. PATENT DOCUMENTS

| | | | |
|---|---|---|---|
| 5,265,056 | * | 11/1993 | Butler et al. .......................... 365/201 |
| 5,491,665 | * | 2/1996 | Sachdev ............................... 365/201 |
| 5,596,538 | * | 1/1997 | Joo ....................................... 365/201 |
| 5,848,018 | * | 12/1998 | McClure ............................... 365/201 |
| 6,115,836 | * | 9/2000 | Churchill et al. ..................... 714/726 |

* cited by examiner

*Primary Examiner*—David Nelms
*Assistant Examiner*—Connie C. Yoha
(74) *Attorney, Agent, or Firm*—Hugh R. Kress; Winstead Sechrest & Minick, P.C.

(57) ABSTRACT

A method and apparatus for testing of semiconductor memory devices. In one embodiment, a test mode of operation is defined for a memory device. In a normal mode of operation, a row line than addressed memory cell is asserted in response to applied external signals corresponding to the beginning of a write-back phase of a read-modify-write cycle. The row line is deasserted on response to applied external signals corresponding to the end of the write-back phase. In the test mode of operation, the row line is asserted in response to the appropriate applied external signals, but deassertion in response to the appropriate applied external signals is suppressed. Instead, deassertion of the row line is forced only upon expiration of a programmable, predetermined time interval following initiation of the write-back phase. The programmable delay can be established by means of an R-C time constant delay circuit. Programmability may be achieved in various ways, including through the provision of metal options selected during the fabrication process, or, alternatively through the provision of laser-actuable fuses or voltage-actuable antifuses. The programmable forced write-back time facilitates reliable comparative testing of multiple parts, and compensates for part-to-part process variations which potentially impact operational performance of different parts to different degrees.

19 Claims, 6 Drawing Sheets

METHOD AND APPARATUS FOR PROGRAMMABLE CONTROL SIGNAL GENERATION FOR A SEMICONDUCTOR DEVICE

This is a continuation of application Ser. No. 09/388,694 filed Sep. 2, 1999 now U.S. Pat. No. 6,141,272.

FIELD OF THE INVENTION

The present invention relates generally to semiconductor devices, and more particularly to a method and apparatus for testing semiconductor memory devices.

BACKGROUND OF THE INVENTION

Those of ordinary skill in the field of semiconductor devices will be familiar with many different types of such devices, including, for example, microprocessors and various types of memory devices, such as dynamic random-access memory devices ("DRAMs"), synchronous DRAMs ("SDRAMS"), static random-access memory devices ("SRAMS") capable of storing millions of bits of digital information.

In many cases, semiconductor devices are required to be operated at very high speeds. For example, the clock signal controlling operation of a microprocessor may be a oscillating square wave having a frequency of several hundred megahertz or more, such that the microprocessor is capable of executing hundreds of thousands or even millions of machine instructions each second. Likewise, semiconductor memory devices, whether synchronous or asynchronous, are preferably capable of being accessed (i.e., having data read from or written to) millions of times per second.

A typical semiconductor device operates by being responsive to a plurality of digital control signals applied to its control signal input terminals (often referred to as "pins"). (As used herein, the term "control signal" is intended to refer to essentially any electrical signal applied to a semiconductor device during operation thereof, including without limitation, control signals, clock signals, test signals, address and data signals and the like.) For example, a DRAM device is responsive to a row address strobe ("RAS") input control signal, a column address strobe ("CAS") input control signal, and a read/write ("R/W") signal. To access a memory device, either to read data from a desired location in the memory or to write data to a desired location, external control circuitry manipulates the logic states of the various applied control signals. A RAS signal conditions a memory device to receive a row address applied to its address pins, a CAS signal conditions a memory device to receive a column address applied to its address pins, and the R/W signal conditions the device to perform either a read operation to, or a write operation from, the memory location specified by the received row and column address signals.

A semiconductor device may be responsive to the logic states of control signals, i.e., a logic "1" represented by a control signal having a "high" voltage of 3.3 to 5 volts, or a logic "0" represented by the control signal having a "low" voltage of zero volts. On the other hand, it is not uncommon for a semiconductor device to be responsive to "edges" of certain control signals, i.e., a rising edge transition from a logic "0" state to a logic "1" state, or a falling edge transition from a logic "1" state to a logic "0" state. As a simplified example, a transition from a logic "1" to a logic "0" in the applied RAS control signal, assuming the logic states of certain other applied control signals are appropriate, may define a row address input interval during which time the memory device uses the address bits applied to its address pins to locate the row of memory to be accessed.

Those of ordinary skill in the art will appreciate that when semiconductor devices are to be operated at very fast rates, the timing of the various applied control signals must be very precise. Control signal timing tolerances, typically specified by semiconductor device manufacturers, must be observed in order to ensure proper device operation. Such tolerance parameters are typically defined for each signal relative to one or more other control signals applied to the device. As a generic example, it may be the case that an edge must occur in one signal within a predetermined period of time following the occurrence of an edge in some other applied signal. As another generic example, it may be specified that one particular control signal must be in a given state (high or low) for at least some predetermined period of time prior to the occurrence of an edge in some other signal. Often, these predetermined periods of time are quite small indeed, on the order of one to three nanoseconds, or in some cases even less.

Precision in control signal timing is important not only for the purposes of normal operation of semiconductor devices, but also—perhaps even more so—for the purposes of semiconductor device testing. Precisely controlling and varying control signal timing is important from the standpoint not only of ensuring that a device will operate properly if specified timing parameters are observed, but also of enabling a tester to determine what timing parameters should be specified for a device under test, or to determine to what extent a particular device might be tolerant to control signal timing variations beyond those specified for the device.

One control signal timing issue of particular relevance to the present disclosure arises in connection with performing a particular type of dynamic random access memory access cycle referred to as a read-modify-write cycle. In a read-modify-write cycle, a DRAM memory cell is first accessed to "read" the data stored therein. During a subsequent portion of the read-modify-write cycle, the content of the accessed cell is replaced with new data. As those of ordinary skill in the art will appreciate, during a memory write cycle, it is important for a sufficient voltage to be established on the digit lines while the cell is being accessed, in order to ensure that sufficient charge is stored in the memory cell to enable reliable sensing of the stored data in a subsequent read cycle. Consequently, memory device manufacturers typically specify a minimum time interval fer the portion of a read-modify-write cycle in which write-data voltage is established on the appropriate digit lines. After this minimum time interval, referred to as the "write back time," the access transistor for the accessed cell is turned off (i.e., the cell's "row select" line is deasserted), decoupling the accessed cell from the digit lines presenting the write data.

The amount of charge stored in a DRAM memory cell is very small. Accordingly, the circuitry responsible for reading and writing data to DRAM memory cells is especially susceptible to so-called "process variation." Process variation as used herein refers to the variations in operation and performance of semiconductor devices arising from essentially inevitable variations in the size, shape, elemental composition, doping content, resistivity, and the like of the semiconductor structures comprising the operational circuitry.

Process variation can result in measurable differences in the performance of otherwise identical semiconductor parts. As a simple example, the same field-effect transistor (FET)

on two discrete semiconductor devices may perform differently as a result of process variation. As a result of process variation, one FET may turn on "harder" than another (i.e., allow more current to flow) in response to the same applied gate voltage. For memory devices, process variation can even lead to variations in the operational behavior from bit to bit within a single device.

The existence of process variation can lead to difficult in specifying minimum operational parameters for semiconductor devices. For example, as a result of process variation, one memory device may operate properly with a particular minimum write-back time interval, while the same write-back time interval may be insufficient in another, identical, device to allow enough charge to be stored in an accessed memory cell.

Although it is possible for a manufacturer to simply specify a minimum write-back interval known to be sufficiently long despite the possibility of process variation, this undesirably prevents the manufacturer from taking advantage of parts tolerant to shorter write-back intervals and hence capable of operating at faster speeds.

Semiconductor device manufacturers typically perform "burn-in" testing and "stress testing" of fabricated parts to verify proper operation within specified timing parameters, as well as to determine whether particular devices might exceed minimum performance criteria and therefore be identified as meeting a higher rating standard. Such testing can also provide the manufacturer with insight into aspects of its design and manufacturing processes, such that such processes can be improved or refined for subsequent generations of parts.

Although there are many benefits to burn-in testing, there are limitations as to what parameters can be manipulated for that purpose. For the most part, the only adjustments that can be made for the purposes of burn-in testing are to the timing of externally applied control signals. There are typically a number of signals present only internally within the semiconductor circuitry, over which external testing equipment can have little or no control as far as timing is concerned.

It is known to provide for a special "test mode" of operation for semiconductor devices. In some cases, the timing of certain signals can be externally manipulated in test mode where they cannot when the device is operated in its normal mode. However, the range of such extra control is typically rather limited.

SUMMARY OF THE INVENTION

In view of the foregoing and other considerations, the present invention relates to a method and apparatus for testing an aspect of a semiconductor device's operational performance.

In accordance with one aspect of the present invention, a semiconductor memory device such as a DRAM is capable of operating in a test mode of operation in which the internal control signal timing for a particular type of memory access cycle is altered as compared with normal operation. In particular, in one embodiment the "write-back" interval during which data voltages are applied to accessed memory cells is programmable in test mode to be longer or shorter than its normal length. This programmability enables testing equipment to more accurately test the device In accordance with another aspect of the invention, the programmability of the write-back interval enables testing equipment to obtain consistent test data from multiple tested devices despite the possibility for inherent differences in the performance of the multiple devices arising due to process variation.

BRIEF DESCRIPTION OF THE DRAWINGS

The foregoing and other features and aspects of the subject invention will be best understood with reference to a detailed description of a specific embodiment of the invention, which follows, when read in conjunction with the accompanying drawings, in which.

DETAILED DESCRIPTION OF A SPECIFIC EMBODIMENT OF THE INVENTION

In the disclosure that follows, in the interest of clarity, not all features of actual implementations are described. It will of course be appreciated that in the development of any such actual implementation, as in any such project, numerous engineering and programming decisions must be made to achieve the developers' specific goals and subgoals (e.g., compliance with system- and business-related constraints), which will vary from one implementation to another. Moreover, attention will necessarily be paid to proper engineering and programming practices for the environment in question. It will be appreciated that such a development effort might be complex and time-consuming, but would nevertheless be a routine undertaking for those of ordinary skill in the field of semiconductor memory devices.

Figure 1:
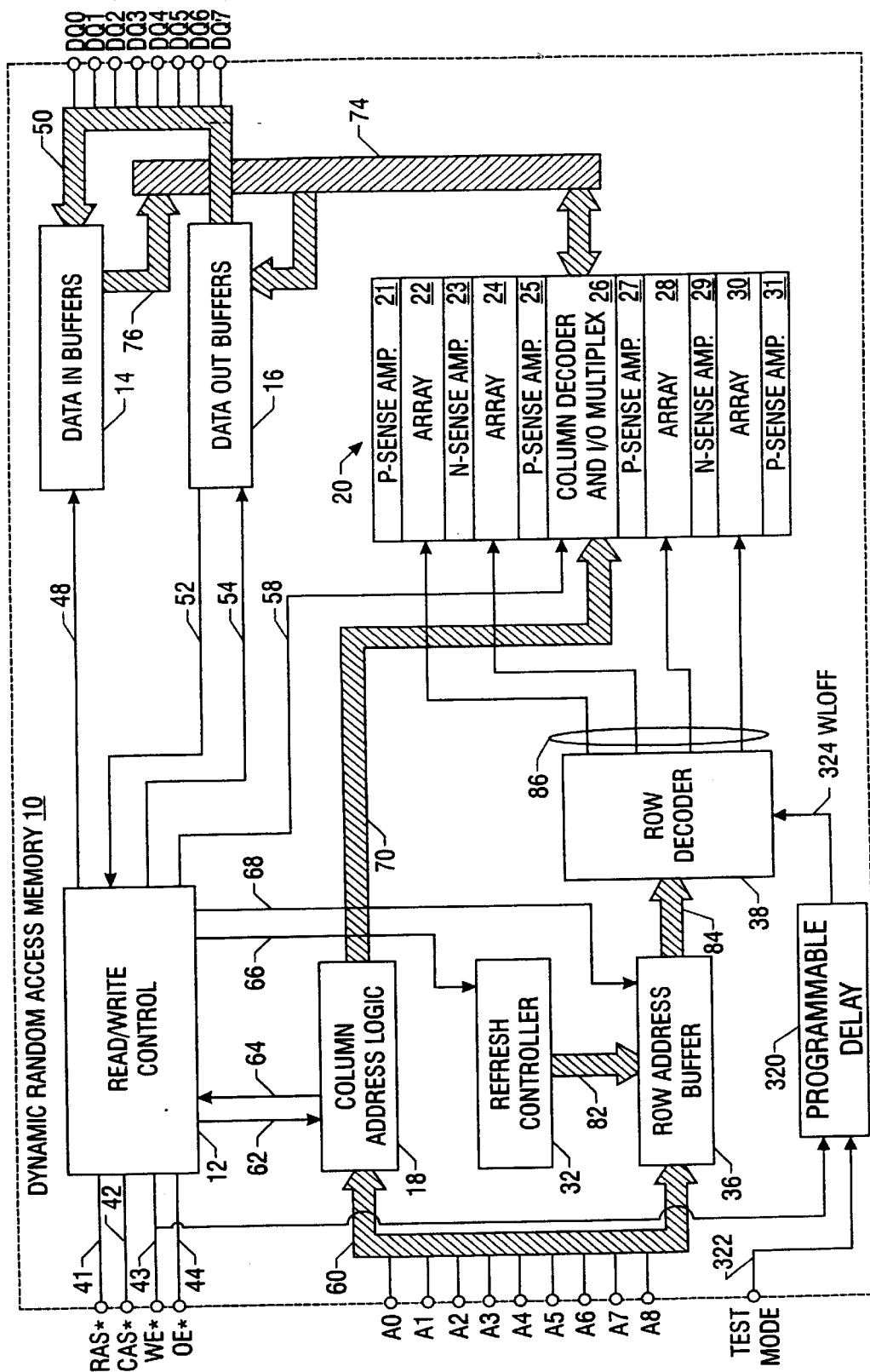
FIG. 1 is a simplified block diagram of a semiconductor memory device in accordance with one embodiment of the invention.

Referring to FIG. 1, there is shown a functional block diagram of a dynamic random access memory device 10 with which the present invention may be advantageously practiced. Memory device 10 is controlled by binary control signals 41 through 44 input from the device pads to a read/write control circuit 12. Control signals 41–44 are conventionally known by names corresponding to the primary function of each signal. Signal 41 is row address strobe Signal 42 is a column address strobe (CAS*). Signal 43 is a write enable (WE). Signal 44 is an output enable (OE). When RAS* falls, the state of address bus 60 is latched in row address buffer 36 in response to control signals 68. When CAS* falls, the state of address bus 60 is latched in column address logic 18 in response to control signals 62.

Read/Write control circuit 12 also responds to changes in the column address as indicated by address change signals 64 for improved read access time as in page mode. Several read and write modes of operation are conducted by read/write control 12 in response to combinations of control signals 41–44 and address change signals 64. Refresh mode is one such operation conducted when RAS* is pulsed while CAS* is low. During refresh mode, a refresh controller 32 generates refresh row address bus 82 in response to control signals on line 66. A row address buffer 36 provides row addresses to row decoder 38 on bus 84. Binary row address bus 84, in response to control signals 68, represents either the address latched when RAS* falls or the refresh row address, depending on the mode of operation.

A single memory cell of memory array 20 is selected for read and write operations according to the intersection of a decoded row signal and a decoded column signal. Binary row address bus 84 is coupled to row decoder 38. Row decoder 38 asserts a row select signal on one or more row activating signals 86. Column address logic 18 presents binary column address bus 70 to column decoder 26. Column decoder 26 asserts a signal for selecting one or more columns, selecting a pair of I/O lines, and coupling these lines to global I/O signals 74, in accordance with conventional memory device operation. If row decoder 38 and column decoder 26 provide signals that activate more than one memory cell from memory array 28, further selection is accomplished by decoding circuitry in column decoder 26. In one embodiment, memory 20 is organized in a plurality of arrays 22, 24, 28, and 30. P-sense amplifiers 21, 25, 27, and 31 are located along digit line pairs (not shown in FIG. 1). N-sense amplifiers 23 and 29 are located along the digit line pair, in one embodiment at or near the midpoint of the distributed capacitance of one of the digit lines.

Sense amplifiers (both P-sense amplifiers and N-sense amplifiers) perform several functions responsive to control -signals 58 shown generally coupled to memory array 20. In refresh mode of operation, the content of a memory cell is refreshed by sense amplifiers. When cell contents are to be overwritten in a write operation, sense amplifiers establish proper cell contents in response to write data signals 76 from data in buffers 14. In read operations cell contents are amplified and presented to data out buffers 16 on global I/O signals 74.

Data-in buffers 14 are used for write operations. Data-in buffers 14 are driven by a data bus 50 which comprises several individual data lines designated as DQ lines. In alternate embodiment, memory devices may have a fewer or greater number of DQ lines and may have separate lines for the data in (D) function and the data out (Q) function. In the presently disclosed embodiment, memory device 10 has eight DQ lines, each of which is bidirectional. Each bidirectional line is driven by a tri-state driver circuit to represent a logic low, a logic high, or an off state. In the off state, the tri-state circuit connects a high impedance to the DQ line so that drive circuits external to memory device 10 can drive a signal onto the DQ line for data-in buffers 14

Write operation is made possible in the memory device of FIG. 1 through the cooperation of data in buffers 14, read/write control 12, and circuits shown generally in FIG. 1 as sense amplifiers and column decoder 26. In response to current and anticipated modes of operation indicated by control signals 41–44, read/write control 12 provides control signals 48 to data-in buffers 14.

Figure 2:
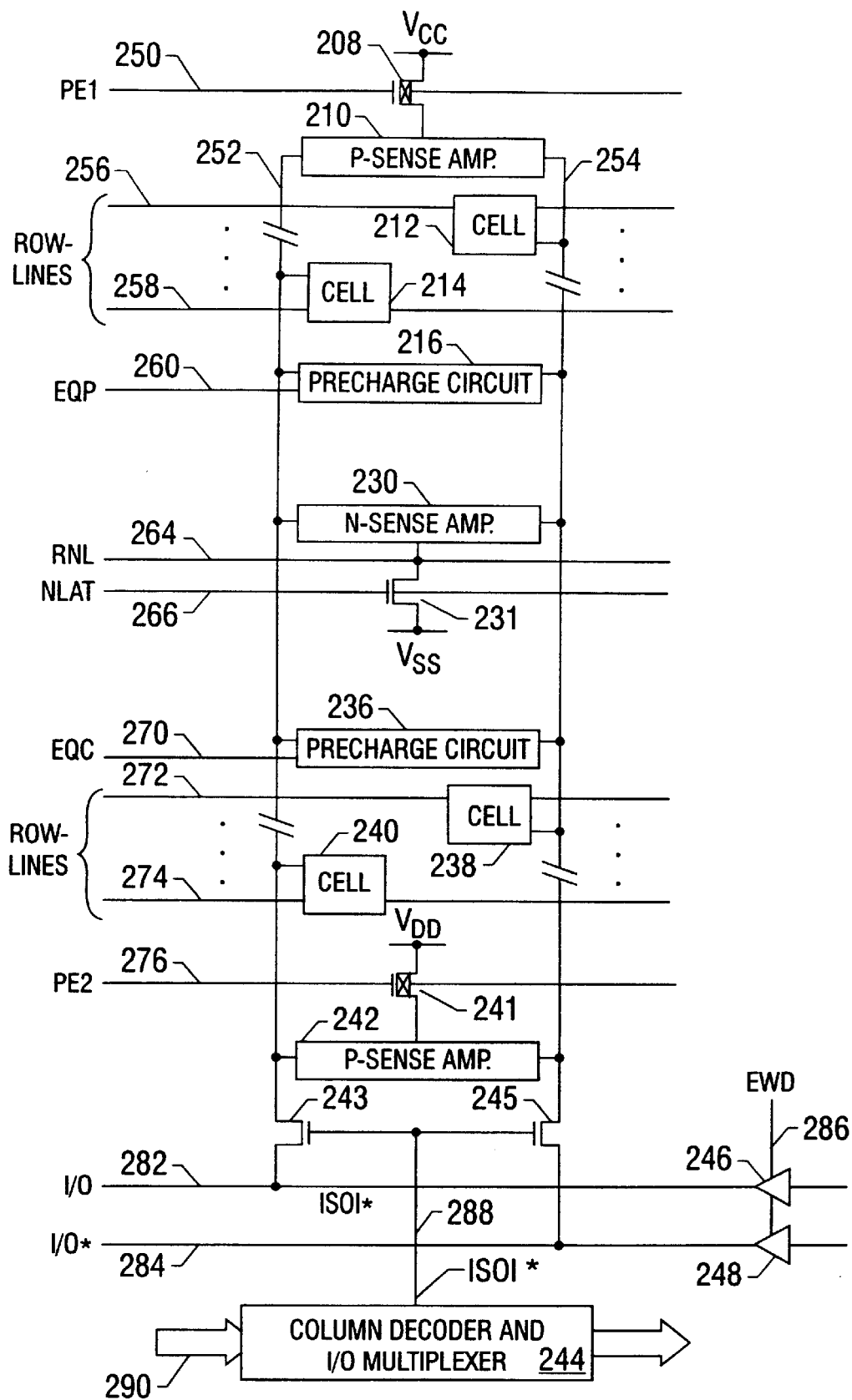
FIG. 2 is a simplified schematic diagram of a portion of the memory device from FIG. 1.

FIG. 2 is a schematic diagram of a portion of memory array 20 shown in FIG. 1. In particular, FIG. 2 depicts circuitry associated two complementary column lines, variously referred to as digit lines. Those of ordinary skill in the art will appreciate that the schematic diagram of FIG. 2 is somewhat simplified and that in actual DRAM implementations, additional circuitry is typically present. The present disclosure limits itself to those components and features of well-known DRAM designs relevant to the subject matter of the present invention, and it is believed that those of ordinary skill in the art having the benefit of the present disclosure would be readily capable of adapting the teachings of the present invention for application in various different DRAM implementations.

FIG. 2 depicts circuitry associated with a pair of column lines 252 and 254. The architecture depicted in FIG. 2 is substantially similar to that disclosed in U.S. Pat. No. 5,506,811 to McLaury, entitled "Dynamic Memory With Isolated Digit Lines," commonly assigned to the Assignee of the present invention. The McLaury '811 patent discloses an architecture in which column lines such as column lines 252 and 254 are divided into separate "digit lines," with the separation being established by means of a plurality of isolation transistors. For the purposes of the present disclosure, however, the division of column lines into separate "digit lines" is of no particular relevance. Accordingly, for the sake of the simplicity and clarity of the present disclosure, the isolation transistors and associated control signals are not depicted in the Figures. It is believed that those of ordinary skill in the art having the benefit of the present disclosure will readily appreciate that the schematic diagram of FIG. 2 is simplified in certain implementation details for the sake of clarity of the present disclosure.

P-sense amplifier 210 acts as an active pull up subcircuit. It is enabled by PE1 signal 250 through device 208. In operation, P-sense amplifier 210 provides a pull up voltage to one of the two column lines 252 and 254.

There are 4 memory cells shown in FIG. 2: cell 212, 214, 238, and 240. Each cell is accessed or "enabled" by one of row lines 256, 258, 272, and 274, respectively. As would be familiar to those of ordinary skill in the art, each memory cell consists of a charge storage device (i.e., a capacitor) and an access transistor. The row lines 256, 258, 272, and 274 are applied to respective gate terminals of a cell's access transistor, such that upon assertion of a row line, one plate of the corresponding cell's capacitor is coupled through the access transistor to a digit or column line. Only one row line is ever active at one time, thereby, connecting only one cell to a column line. When row line 256 is active, cell 212 is connected to column line 254 and column line 252 would not have a cell connected to it.

Precharge circuit 216 is enabled by EQP signal 260. The precharge circuit 216 establishes equilibration voltages and set up conditions on column lines 252 and 254. N-sense amplifier 230 provides an active pull down subcircuit. N-sense amplifier 230 is enabled through device 231 by RNL signal 264 and NLAT signal 266.

Precharge circuit 236 is enabled by EQC signal 270. Precharge circuit 236 operates similarly to precharge circuit 216. P-sense amplifier 242 functions similarly to P-sense amplifier 210. P-sense amplifier 242 is enabled by PE2 signal 276 through device 241. Column lines 252 and 254 are coupled to I/O lines 282 and 284 respectively through isolation transistors 243 and 245. Isolation transistors 243 and 245 are enabled by ISOI* signal 288. Column decoder 244 provides ISOI* 288 in response to a portion of column address bus 70 (shown in FIG. 1) depicted in FIG. 2 as column address signals 290.

Drivers 246 and 248 are enabled by signal EWD signal 286. During a write operation, data signals present at the inputs of drivers 246 and 248 are driven onto I/O lines 282 and 284. The operation of the circuitry shown on FIG. 2 may be better understood by referring to the timing diagram of FIGS. 3a and 3b.

Figure 3A:
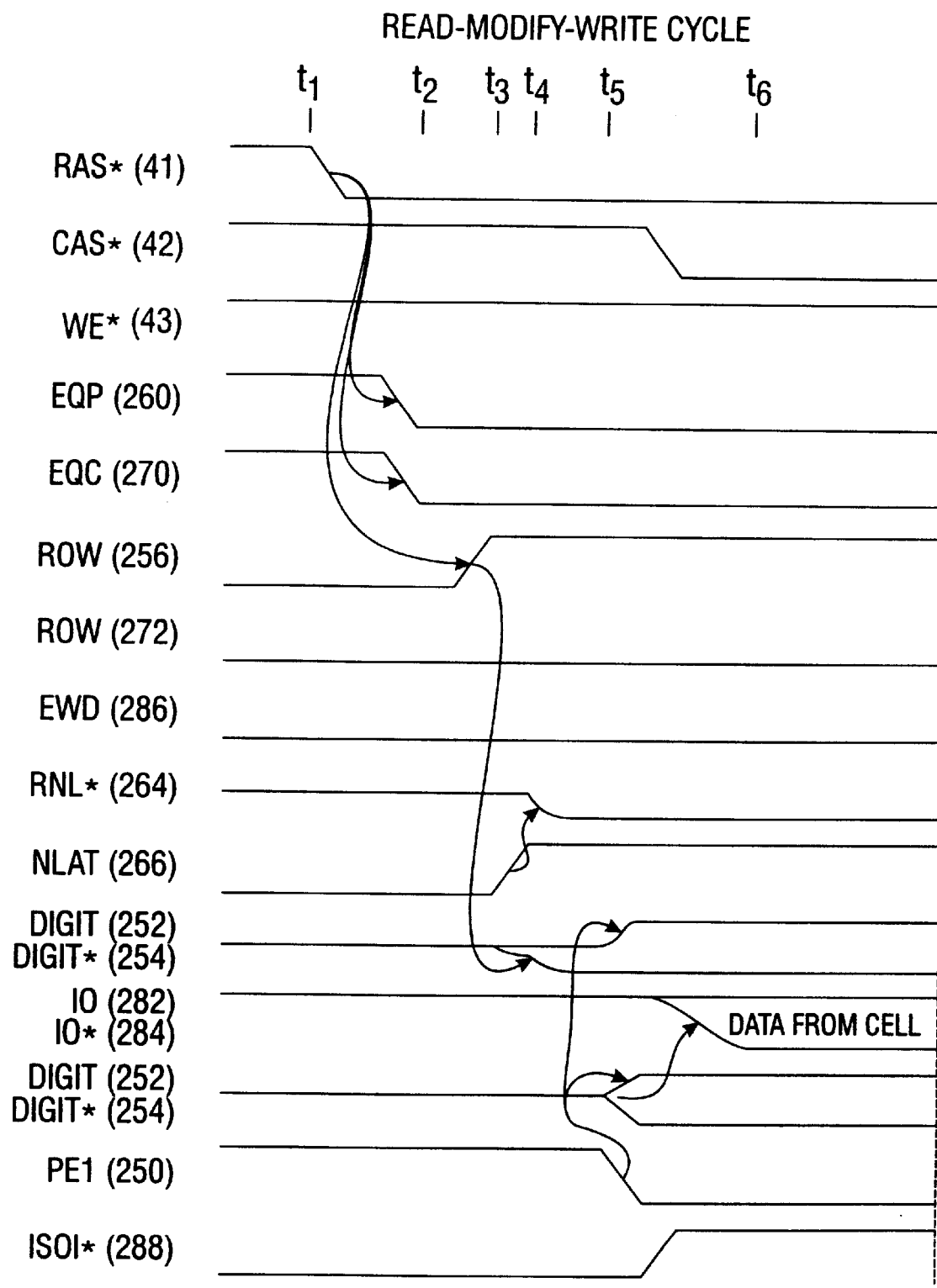
FIGS. 3a and 3b together comprise a timing diagram showing certain internal and external signals present in the memory device of FIG. 1 during a read-modify-write operation of the memory device.
Figure 3B:
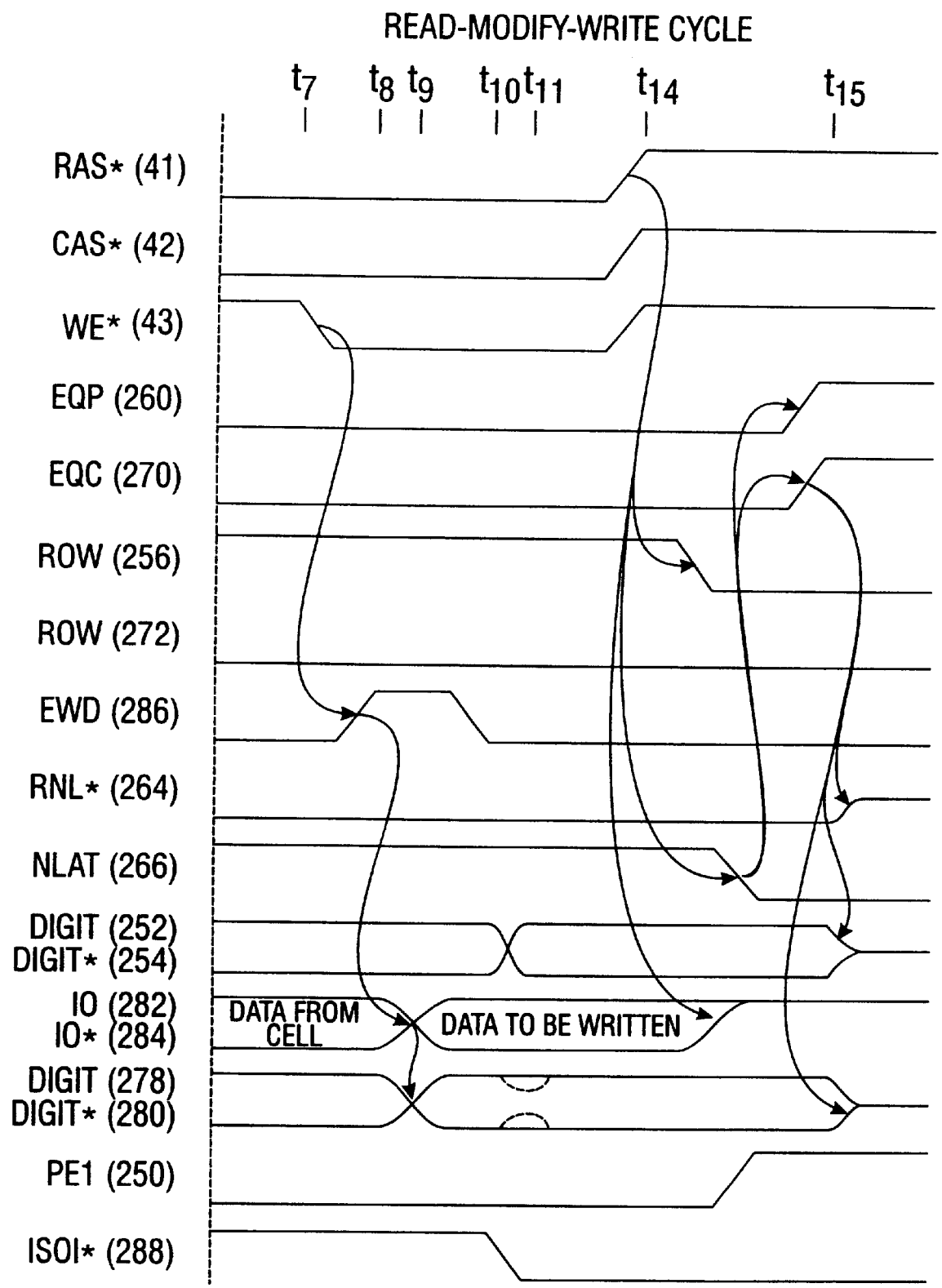

In particular, FIGS. 3a and 3b present a timing diagram of a read-modify-write cycle using the circuitry shown in FIG. 2, particularly cell 212. From time T1 to time T5, N-sense amplifier 230 attains a state corresponding to data in the addressed cell. For example, if cell 212 is addressed, digit lines 252 and 254 are coupled to N-sense amplifier 230. Finally, N-sense amplifier 230 is activated by signals RNL* and NLAT at times T3 and T4. At time T5, digit lines 252 and 254 are beginning to separate corresponding to data in the addressed cell. Data from the cell appears on I/O lines 282 and 284 at time T6.

At time T7, WE* falls while CAS* is low, indicating the beginning of the write portion of Hi the read-modify-write cycle (also referred to as "write back"). From time T8 to time T11, drivers 246 and 248 are enabled and coupled to N-sense amplifier 230. After N-sense amplifier 230 attains a state corresponding to input data from drivers 246 and 248, N-sense amplifier 230 writes to cell 212.

Figure 4:
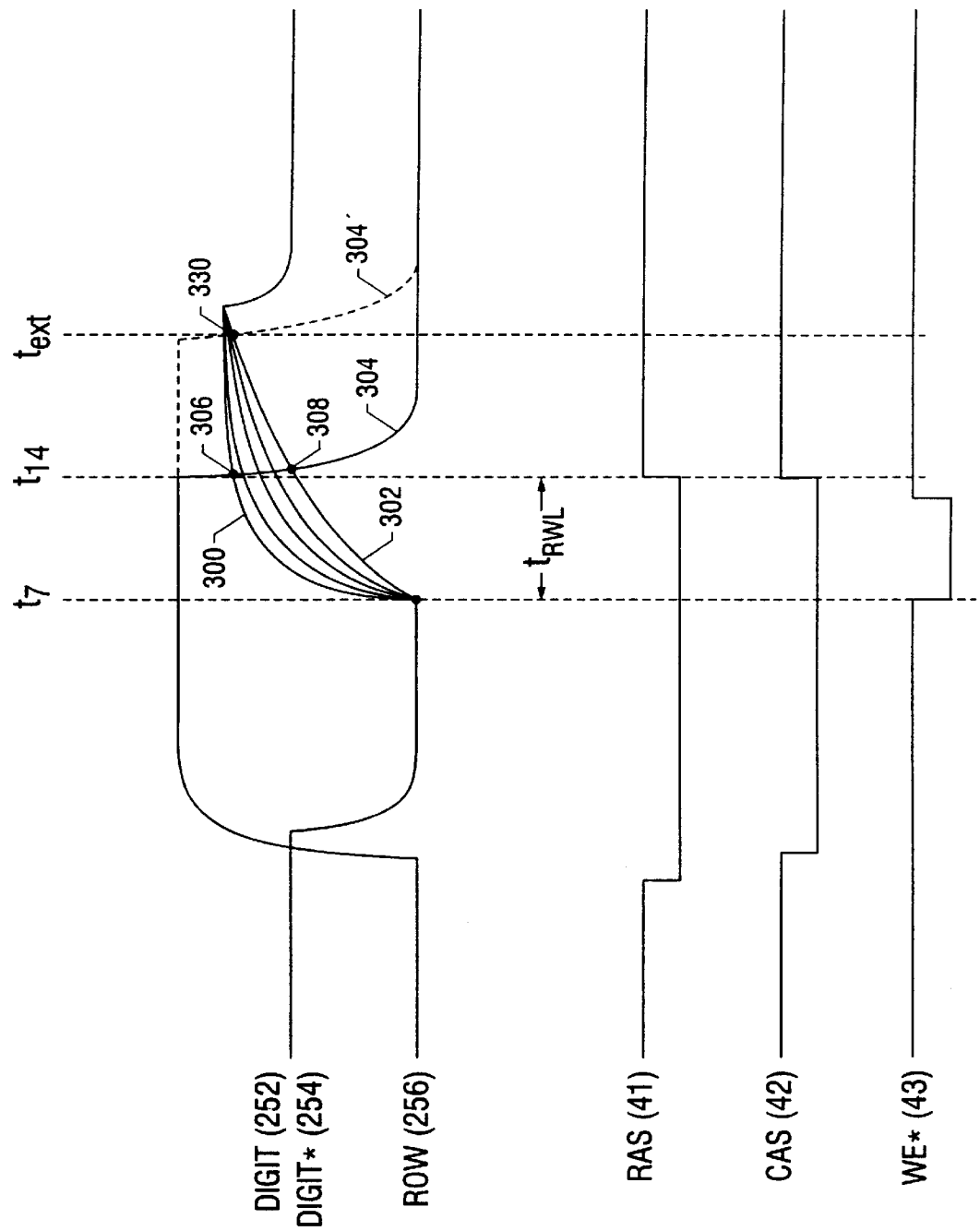
FIG. 4 is a timing diagram showing some of the signals from FIGS. 3a and 3b during the write-back portion of the read-modify-write operation of FIGS. 3a and 3b.

Turning now to FIG. 4, there is shown a somewhat more detailed timing diagram showing certain internal and external electrical signals present in the memory device from FIG. 1 during the write-back portion of a read-modify-write cycle. As shown in FIG. 4, the write-back portion of the cycle begins at time $t_7$ when the write-enable (WE*) signal 43 is asserted (low). It is to be noted that at this time, the RAS* and CAS* signals 41 and 42, respectively, are already asserted (low) as a result of earlier steps in the read-modify-write cycle, as previously noted with reference to FIGS. 3a and 3b. In accordance with industry standard operation, the simultaneous assertion of RAS* 41, CAS* 42 and WE* 43 heralds a write operation in which data applied to I/O lines 282 and 284 is stored in the memory cell being accessed.

Upon assertion of WE* 43, the data to be written to the accessed memory cell (memory cell 212 in the example of FIG. 4) is applied to complementary digit lines DIGIT/DIGIT* 252 and 254. (Those of ordinary skill in the art will appreciate that this causes a high voltage to be applied to one of digit lines 252 and 254 and a low (e.g., zero) voltage to be applied to its complement. For the sake of clarity, the voltage of only the digit line to which a high voltage is applied is represented in FIG. 4, and is referred to in the following description as "digit line 252/254" to reflect the fact that either digit line 252 or 254 may receive the high voltage, depending upon the digital value to be stored in memory cell 212.) As can be seen from FIG. 4, when observed in a very precise time scale, the rise in voltage on the digit line 252/254 is not instantaneous, but rather relatively gradual. The electronic and structural factors which prevent an instantaneous voltage rise are well understood by those of ordinary skill in the art. Further, it is well understood by those of ordinary skill in the art that the rise time for digit line voltages will vary as a result of many factors, including semiconductor fabrication process variations and the like. Such process variations lead to part-to-part and cell-to-cell variations in the operation and performance of the circuitry involved in generation of the digit line voltages, such variations leading to variability in the rate at which a full voltage will be attained on the digit line 2521254.

With continued reference to FIG. 4, once the data from I/O lines 282 and 284 is applied to digit line 252/254, the write portion of the read-modify-write cycle is terminated by deassertion of RAS* signal 41 and CAS* signal 42, at time $t_{14}$. The interval between time $t_7$, when WE* 43 is asserted to initiate the write operation, to time $t_{14}$, when RAS* 41 is deasserted to terminate the write operation, is referred to as the "write command to RAS* lead time," or $t_{RWL}$. The $t_{RWL}$ interval is one of the parameters for which semiconductor memory manufacturers will typically specify a minimum value, on the order of ten to fifteen nanoseconds or so in modem day memory devices.

Deassertion of RAS* signal 41 at the conclusion of the $t_{RWL}$ interval causes row line 256 to be deasserted. This, in turn, decouples the accessed memory cell (memory cell 212 in the present example) from digit lines 252 and 254. Those of ordinary skill in the art will appreciate, therefore, that upon deassertion of RAS* signal 41, it is important for a full voltage to have been established on digit line 252/254, in order to ensure that a full charge is stored in the accessed memory cell.

From FIG. 4, on the other hand, it is apparent that the voltage on digit line 252/254 and hence the amount of charge stored in memory cell 212 can be notably higher or lower depending upon the rise time of the digit line voltage. Thus, the amount of charge stored is susceptible to variance due to the same process variation as the digit line voltage rise time. FIG. 4 shows that, for a given $t_{RWL}$ interval, this variance can be significant. In FIG. 4, an example of a "fast" rise time for digit line 252/254 is designated with reference numeral 300, while an example of a relatively slower rise time for digit line 252/254 is designated with reference numeral 302. It can be observed in FIG. 4 that a given falling edge 304 of row line 256 intersects "fast" rise-time digit line 252/254 at a substantially higher voltage (at reference numeral 306) than it intersects slower rise-time digit line 252/254 (at reference numeral 308).

Those of ordinary skill in the art will appreciate that for the purposes of testing of semiconductor devices, it is often desirable to operate individual parts under conditions and with such timing parameters that tend to push the limits of the device's operational capabilities. This is desirable in order to ensure that devices are being manufactured within acceptable tolerances, and that the devices will operate properly if the manufacturer's recommended parameter values are adhered to.

As noted above, the $t_{RWL}$ interval is one parameter for which manufacturers will typically specify a minimum value. That is to say, a manufacturer will typically specify that a given memory device will operate properly only if external timing and control signals such as RAS* 41, CAS* 42, and WE* 43 are applied in a manner which ensures that the $t_{RWL}$ interval is no shorter than some predetermined length. For the purposes of testing such a device, therefore, it may be desirable to operate a device under test with control signals which cause the $t_{RWL}$ interval to be just at—or perhaps even below—the specified minimum value. The testing can further involve measurement of the voltage level of digit line 252/254 at the relevant time to establish that the device stores an acceptable amount of charge in a memory cell for a given $t_{RWL}$ interval. By testing the limits of a device's operational capabilities in this way, the manufacturer ensure quality control and gain insight into the design and operation of the device.

The aforementioned process variations, however, can make it difficult to utilize data obtained from testing of multiple tested devices. Because of process variations, two otherwise identical devices or memory cells may perform differently under identical test operating conditions. For a given the $t_{RWL}$ interval, for example, one device or memory cell with a "fast" digit line rise time may have what is regarded as sufficient voltage on digit line 252/254 at the end of the $t_{RWL}$ interval, while another device or memory with a relatively slower digit line rise time might not.

In conventional semiconductor memory devices, the $t_{RWL}$ interval is established only indirectly as a logical function of the states of such external signals as RAS* 41 and CAS* 42. It is apparent from the timing diagrams of FIGS. 3a, 3b, and 4, for example, that in memory 10 in accordance with the presently disclosed embodiment of the invention the end of the write portion of a read-modify-write cycle is triggered in part off of the rising edge of RAS* signal 41. That is, row line 256 goes low in response to deassertion of RAS* signal 41.

In accordance with one aspect of the present invention, memory device 10 is advantageously provided with a programmable forced write back time capability for programmably controlling the length of the $t_{RWL}$ interval. Specifically, in the presently disclosed embodiment, a separate test mode of operation is provided in which the length of the $t_{RWL}$ interval is not determined by the rising edge of RAS* 41, as it is in normal operation.

To this end, referring once again to FIG. 1, memory 10 in accordance with the presently disclosed embodiment of the invention incorporates a programmable delay element 320. Programmable delay 320 receives as its input the externally-applied WE* signal 43, as well as a TEST MODE signal 322 that is asserted to place memory device 10 into a test mode of operation. As an output, programmable delay 320 generates a WLOFF signal 324 that is applied to row decoder 38. In the presently disclosed embodiment of the invention, decoder 38 is responsive to assertion of WLOFF signal 324 to force all row lines low.

Figure 5:
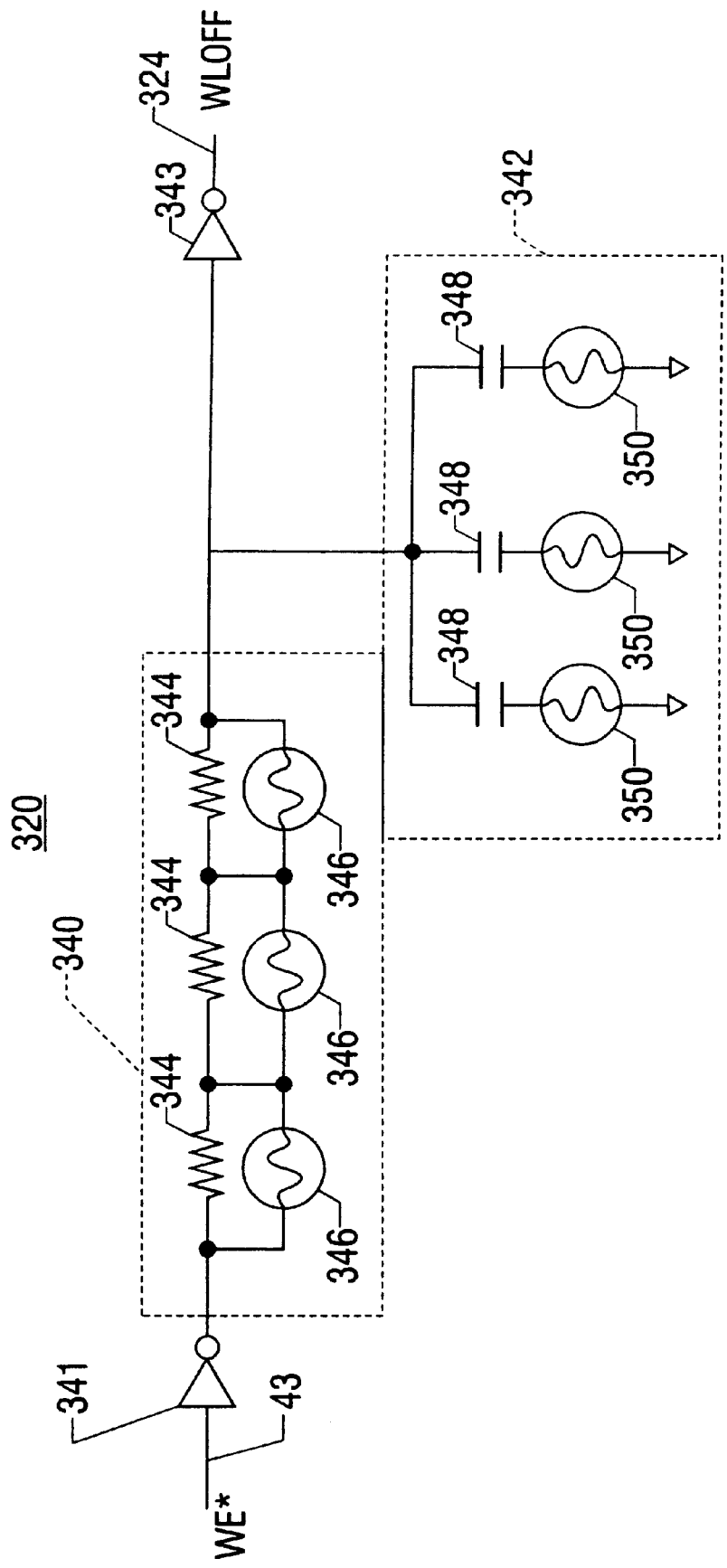
FIG. 5 is a simplified schematic diagram of a programmable delay element in the memory from FIG. 1.

Those of ordinary skill in the art will appreciate that there are a number of ways of implementing programmable delay 320. In one embodiment, programmable delay 320 consists of a variable resistance and a variable capacitance configured to introduce an R-C delay. An example of such an implementation is shown in FIG. 5 to comprise a resistor network 340 and a capacitor network 342 coupled between an input buffer 341 and an output buffer 343. As shown in FIG. 5, resistor network 340 comprises a plurality of resistors 344 and a corresponding plurality of fuses 346. Variability in the effective resistance of resistor network 340 is achieved through the selective blowing of one or more of the fuses 346 therein. (It is to be understood that although only three resistors 344 and three fuses 346 are shown in FIG. 5, any given implementation may include a greater or lesser number of fuses and resistors.) Likewise, capacitor network 342 comprises a plurality of capacitors 348 and a plurality of fuses 350. Variability in the effective capacitance of capacitor network 342 is achieved through the selective blowing of one or more of the fuses 350 therein. (As with resistor network 340, although three capacitors 348 and three fuses 350 are shown in FIG. 5, any given implementation may include a greater or fewer number, as desired.)

R-C circuits such as depicted in FIG. 5 are common and well-known to those of ordinary skill in the art. The R-C circuit's output may be coupled to an inverter or level detector configured to switch at some time following application of an input pulse to the R-C circuit. The length of the delay is adjustable through adjustment of either the resistance or the capacitance or both of the R-C circuit. In such an implementation, the resistance and/or capacitance of the R-C circuit can be programmed by selectively shorting and/or opening metal options on the integrated circuit. Alternatively, programming may be accomplished through the use of laser fuses or anti-fuses associated with the R-C circuit. It is believed that it would be a matter of routine engineering to those of ordinary skill in the art having the benefit of the present disclosure to select from among the many well-known options for implementing a delay circuit 320 suitable for the purposes of the present disclosure.

Referring once again to FIG. 4, the effects of programmable delay 320 in establishing the $t_{RWL}$ interval can be observed. As discussed above, during normal operation, the $t_{RWL}$ interval is determined based on the rising edge of RAS* 41 at time $t_{14}$. Further, it was noted above that an for a given $t_{RWL}$ interval, the voltage on digit line 252/254 may be notably less for a part with a slower digit line rise time than for a part with a faster digit line rise time; this can be observed by comparing intersection points 306 and 308 in FIG. 4.

On the other hand, when memory device 10 is placed into test mode by asserting the TEST MODE signal 322, row decoder is rendered responsive to the WLOFF signal 324 generated by programmable delay 320, rather than RAS* 41, to turn row line 256 off following a read-modify-write signal. Accordingly, programmable delay 320 can be programmed to make the effective $t_{RWL}$ interval longer (or shorter) than it would be in normal operation. For example, in FIG. 4, digit line 252/254 having the slower rise time designated with reference numeral 302 intersects the falling edge 304 of row line 256 at point 308. However, if programmable delay 320 is programmed appropriately, the falling edge of row line 256 can be delayed, as represented by dashed line 304' in FIG. 4, such that slower rising digit line 302 intersects falling edge 304' at substantially the same voltage level as intersection 306 with faster rise time 300. The intersection of row line voltage 256 with slower rise time digit line voltage 302 is designated with reference numeral 340 in FIG. 4. In this way, programmable delay 320 can function to compensate for part-to-part process variation.

From the foregoing detailed description of a specific embodiment of the invention, it should be apparent that a method and apparatus for testing semiconductor memory devices has been disclosed. The disclosed method and apparatus involves placing a device into a test mode wherein a row line asserted in a write-back phase of a read-modify-write memory access cycle is not deasserted in the normal manner in response to external applied control signals indicating completion of the write-back phase. Normal deassertion of the row line is suppressed, and deassertion is instead forced only after a programmable, predetermined time interval following initiation of the write-back phase.

Although a specific embodiment of the invention has been disclosed herein in some detail, this has been done solely for the purposes of illustrating various aspects and features of the invention, and is not intended to be limiting with respect to the scope of the invention. It is contemplated that various substitutions, alterations, and/or modifications, including but not limited to those design alternatives which might have been specifically noted in this disclosure, may be made to the disclosed embodiment without departing from the spirit and scope of the invention as defined in the appended claims.

In particular, for example, it is contemplated that although the present invention has been disclosed in the context of a dynamic random access memory having a particular organization and architecture, it is believed that it would be a matter of routine engineering to those of ordinary skill in the art having the benefit of the present disclosure to practice the invention disclosed herein in the context of many different types and architectures of memory, it including, without limitation, conventional DRAMs, synchronous DRAMs (SDRAMs), extended data out (EDO) DRAMs, and so on.

What is claimed is:

1. A method of compensating for process variation in a semiconductor memory device to be subjected to testing, comprising:

(a) providing a row decoder circuit adapted to assert a row line signal in response to applied address signals and to deassert said row line signal in response to deassertion of a row decoder control signal;

(b) providing a test mode circuit responsive to assertion of test mode signal to render said row decoder circuit unresponsive to deassertion of said row decoder control signal, such that said row decoder circuit does not deassert said row line signal in response to deassertion of said row decoder control signal.

2. A method in accordance with claim 1, wherein said row decoder control signal is a row address strobe signal.

3. A method in accordance with claim 1, wherein said test mode signal is applied from external to said semiconductor device.

4. A method in accordance with claim 1, wherein said test mode circuit is further responsive to assertion of said test mode signal to apply a substitute row decoder control signal to said row decoder circuit, and wherein said row decoder is responsive to said assertion of said test mode signal and said substitute row decoder control signal to deassert said row line signal.

5. A method in accordance with claim 4, wherein said test mode circuit asserts said substitute row decoder control signal after a programmable delay following initiation of a write-back operation.

6. A method in accordance with claim 5, further comprising:

(c) pre-programming an interval for said programmable delay.

7. A method in accordance with claim 6, wherein said step (c) of pre-programming said interval for said programmable delay comprises adjusting a time constant of an RC delay circuit.

8. A method in accordance with claim 7, wherein said adjusting a time constant of an RC delay circuit comprises selectively shorting at least one resistance element in said RC delay circuit.

9. A semiconductor memory device, comprising:

an array of rows and columns of memory cells;

a row decoder circuit coupled to said array, said row decoder circuit being responsive in a first mode of operation to initiation of a write-back operation in said memory device to assert a row line signal and to subsequently deassert said row line signal in response to deassertion of a row decoder control signal;

a test mode circuit coupled to said row decoder circuit, said test mode circuit being responsive to a test mode signal to suppress said row decoder circuit from deasserting said row line signal in response to said deassertion of said row decoder control signal.

10. A semiconductor memory device in accordance with claim 9, wherein said row decoder control signal comprises a row address strobe signal applied from external to said semiconductor memory device.

11. A semiconductor memory device in accordance with claim 9, wherein said test mode circuit comprises:

a programmable delay circuit, responsive to initiation of said write-back operation to assert a substitute row decoder control signal following a predetermined delay from initiation of said write-back operation.

12. A semiconductor memory device in accordance with claim 11, wherein said delay circuit comprises an RC delay circuit comprising at least one resistor element and at least one capacitor element.

13. A semiconductor memory device in accordance with claim 12, wherein the duration of said predetermined delay is programmable through adjustment of the resistive value of said at least one resistor element.

14. A semiconductor memory device in accordance with claim 13, wherein the duration of said predetermined delay is programmable through adjustment of the capacitive value of said at least one capacitor element.

15. A method of testing operation of a semiconductor memory device performing a write-back operation involving in a normal mode of operation the assertion of a row line signal upon the initiation of the write-back operation and deassertion of said row line signal in response the deassertion of a row address strobe signal, comprising:

(a) placing said semiconductor memory device into a test mode of operation;

(b) when said semiconductor memory device is in said test mode of operation, suppressing deassertion of said row line signal in response to deassertion of said row address strobe signal;

(c) when said semiconductor memory device is in said test mode of operation, deasserting said row line signal after a predetermined delay initiated upon initiation of said write-back operation.

16. A method in accordance with claim 15, wherein said step (a) of placing said semiconductor memory device into a test mode of operation comprises assertion of a test mode signal from external to said memory device.

17. A method in accordance with claim 15, further comprising:

(d) adjusting the duration of said predetermined delay in response to observed operation of said memory device operating in said test mode.

18. A method in accordance with claim 17, wherein said step (d) of adjusting the duration of said predetermined delay comprises adjusting a time constant of an RC delay circuit.

19. A method in accordance with claim 18, wherein said step (d) of adjusting the duration of said predetermined delay comprises adjusting a resistive value of a resistive element in said RC delay circuit.

* * * * *